United States Patent [19]

Ohara

[11] Patent Number: 5,068,694
[45] Date of Patent: Nov. 26, 1991

[54] JOSEPHSON INTEGRATED CIRCUIT HAVING A RESISTANCE ELEMENT

[75] Inventor: Shiro Ohara, Sagamihara, Japan

[73] Assignee: Fujitsu Limited, Kawasaki, Japan

[21] Appl. No.: 635,446

[22] Filed: Dec. 28, 1990

[30] Foreign Application Priority Data

Dec. 29, 1989 [JP] Japan .................... 1-340410
Sep. 25, 1990 [JP] Japan .................... 2-254543

[51] Int. Cl.$^5$ ............... H01L 39/22; H01L 29/12; H01L 1/012; B05D 5/12
[52] U.S. Cl. ......................................... 357/5; 357/10; 357/65; 357/67; 357/71; 427/101; 338/307
[58] Field of Search ............. 357/10, 5, 71; 427/101

[56] References Cited

U.S. PATENT DOCUMENTS

| 3,588,638 | 6/1971 | Fleming | 357/10 |
| 3,665,599 | 5/1972 | Herczog et al. | 427/102 |
| 3,670,221 | 6/1972 | Hamamoto et al. | 357/10 |
| 4,035,819 | 7/1977 | Nitta et al. | 427/101 |
| 4,209,764 | 6/1980 | Merz et al. | 427/101 |
| 4,904,980 | 2/1990 | Przybysz et al. | 357/5 |
| 5,021,867 | 6/1991 | Przybysz | 357/5 |

Primary Examiner—William Mintel
Assistant Examiner—Mahshid Saadat
Attorney, Agent, or Firm—Armstrong, Nikaido, Marmelstein, Kubovcik & Murray

[57] ABSTRACT

A Josephson integrated circuit comprises a substrate formed with a Josephson device, a resistance strip of zirconium provided on the substrate, a first refractory metal layer provided on a first region of the resistance strip; a second refractory metal layer provided on a second region of the resistance strip that is separated from said first region, a first superconductor interconnection pattern provided on the substrate so as to cover the first refractory metal layer, and a second superconductor interconnection pattern separated from the first superconductor interconnection pattern and provided on the substrate so as to cover the second refractory metal layer.

3 Claims, 6 Drawing Sheets

JOSEPHSON INTEGRATED CIRCUIT HAVING A RESISTANCE ELEMENT

BACKGROUND OF THE INVENTION

The present invention generally relates to Josephson integrated circuits and more particularly to a Josephson integrated circuit including therein a resistance element.

Intensive efforts are made on the development of ultra-fast integrated circuits that employ the Josephson junctions. Typically, the Josephson junction is formed by an $AlO_x$ tunneling barrier film sandwiched by a pair of niobium superconducting layers. Such a Josephson integrated circuit generally includes resistance elements, and molybdenum or zirconium is commonly used for the resistance material that forms the resistance element. Particularly, zirconium is preferred for the resistance element as it shows the etching rate that is substantially smaller than that of niobium used for the superconducting interconnection pattern. Thereby, the fabrication of the resistance element that includes the step of patterning the metal layer of resistance material by etching, is substantially simplified.

FIGS. 1A-1D show the conventional process for providing the zirconium resistance element.

Referring to the FIG. 1A, a zirconium layer 11 acting as a resistance strip is first deposited on a silicon substrate by a sputtering process and the like, and patterned subsequently to form a zirconium strip having a desired resistance value. In this process of patterning, the substrate 10 is removed from the deposition apparatus and transported to an etching apparatus. During this transportation, the surface of the zirconium layer 11 is inevitably exposed to the air, and there is formed an oxide film 11a of zirconium on the surface of the zirconium layer 11. Generally, the oxide of zirconium shows a semiconductor characteristic in the room temperature but behaves like an insulator at extremely low temperatures such as 4.2° K. that is the temperature used for operating the Josephson devices. In other words, the surface of the zirconium layer 11 is entirely covered by the insulating zirconium oxide film. The thickness of this zirconium film 11a may be about 2-3 nm while the thickness of the zirconium strip 11 may be about 100 nm, depending on the desired resistance value of the resistance element. After the transportation to the etching apparatus, the zirconium layer 11 is patterned by a reactive ion etching process (RIE) and the like, using a carbon tetrachloride ($CCl_4$) etching gas, into a zirconium strip as shown in FIG. 1A. It should be noted that the RIE process using CCl acts on zirconium and niobium with substantially the same etching rate.

On this zirconium strip 11, a niobium superconducting interconnection is deposited. As this oxide film 11a prevents the electrical connection to the zirconium strip 11, the structure of FIG. 1A is first subjected to a sputter-etching process, wherein the zirconium oxide layer 11a is removed by an bombardment of argon ions as shown in FIG. 1B. This sputter-etching process is continued until substantially entire oxide layer 11a is eliminated.

After the removal of the oxide layer 11a, a niobium layer 12 is deposited to bury the zirconium strip 11 underneath as shown in FIG. 1C, and the niobium layer 12 is patterned into a first conductor segment 12a and a second conductor segment 12b that are separated with each other as shown in FIG. 1D, with the zirconium strip 11 intervening between the conductor segment 12a and the conductor segment 12b. This patterning is achieved by an RIE process using carbon tetrafluoride ($CF_4$) as the etching gas. Thereby, both the first and second conductor segments 12a and 12b are connected electrically to the zirconium strip 11. As the RIE process acts selectively on niobium, the zirconium strip 11 remains substantially intact even when the niobium layer 12 is patterned.

In the foregoing process, it will be immediately understood that the process has a problem in the step of FIG. 1B for removing the oxide film 11a. As the bombardment of argon ions is indiscriminate whether the subject is the oxide film 11a or the zirconium strip 11, there is a substantial risk that the zirconium strip 11 itself is subjected to the sputter-etching process after the oxide film 11a is removed. When this occurs, the resistance value of the resistance element is inevitably deviated from the designed resistance value. At the moment, it is extremely difficult to stop the sputter-etching process exactly at the moment when the top surface of the zirconium strip 11 is exposed. Further, the foregoing conventional structure of FIG. 1D suffers from a problem of time-dependent variation in the resistance value of the resistance element as will be described later with reference to the effect of the present invention.

When molybdenum is used for the resistance strip 11 in place of zirconium, on the other hand, there arises a problem in the step of FIG. 1D for patterning the niobium superconductor layer, because the molybdenum has an etching rate that is substantially identical with the etching rate of niobium. Thus, the patterning process of FIG. 1D would entirely remove away the molybdenum resistance strip 11. In order to avoid this, one has to protect a part of the surface of the strip 11 corresponding to the part exposed in the structure of FIG. 1D by a material such as silicon oxide that is immune to the etching process. However, provision of such a protective region requires a complex deposition and patterning process between the step of FIG. 1B and the step of FIG. 1C and is not desirable.

SUMMARY OF THE INVENTION

Accordingly, it is a general object of the present invention to provide a novel and useful Josephson integrated circuit wherein the foregoing problems are eliminated.

Another object of the present invention is to provide a Josephson integrated circuit including therein a resistance element of zirconium wherein the zirconium resistance element has a designed resistance value.

Another object of the present invention is to provide a Josephson integrated circuit including therein a resistance element of zirconium wherein the variation of the resistance value of the zirconium element with time is substantially eliminated.

Another object of the present invention is to provide a Josephson integrated circuit that includes a Josephson junction therein, said Josephson integrated circuit comprising: a substrate having an upper major surface and a lower major surface; a resistance strip of zirconium defined by a lower major surface and an upper major surface and provided on the upper major surface of the substrate; a first refractory metal layer having a lower major surface and an upper major surface and provided on a first region of the upper major surface of the resistance strip; a second refractory metal layer having a lower major surface and an upper major surface and provided on a second region of the upper major surface of the resistance strip that is separated from said first region; a first superconductor interconnection pattern provided on the upper major surface of the substrate so as to cover the upper major surface of the first refractory metal layer; and a second superconductor interconnection pattern separated from the first superconductor interconnection pattern and provided on the upper major surface of the substrate so as to cover the upper major surface of the second refractory metal layer. The refractory metal used for the first and second refractory metal layers may include niobium, molybdenum, titanium, vanadium, tantalum, tungsten, platinum and palladium. According to the present invention, it was found that the variation of the resistance of the zirconium resistance strip with time is significantly improved over the prior art construction.

Another object of the present invention is to provide a method for fabricating a Josephson integrated circuit that includes therein a Josephson junction and a resistance element formed on a substrate, comprising the steps of: depositing a zirconium layer on the substrate of the Josephson integrated circuit; depositing a refractory metal layer of a refractory metal that shows an etching rate substantially smaller than that of zirconium when applied to an etching process, on said zirconium layer, said step of deposition of the refractory metal layer being achieved after the step of deposition of the zirconium layer without exposing the zirconium layer to the air; patterning the zirconium layer and the refractory metal layer into a resistance strip; removing an oxide layer that is formed on said refractory metal layer in the step of patterning, from the resistance strip; depositing a superconductor layer on said refractory metal layer; patterning the superconductor layer to form a superconducting interconnection pattern connected to the resistance strip, said patterning of the superconductor layer being achieved by an etching process that removes a part of the superconducting layer located above the resistance strip and the refractory metal layer selectively with respect to the zirconium layer forming the resistance strip. According to the present invention, the risk of the zirconium layer in the resistance strip being removed in the step of removing the oxide layer is substantially eliminated by the provision of the refractory metal layer protecting the zirconium layer, and the undesirable change in the thickness of the zirconium layer acting as the resistance strip is eliminated. Thereby, unwanted variation in the resistance value of the resistance strip is eliminated. As the refractory metal used for the refractory metal layer has an etching rate that is substantially larger than that of zirconium, the etching employed at the time of patterning of the superconductor layer does not affect the thickness of the zirconium resistance strip.

Other objects and further features of the present invention will become apparent from the following detailed description when read in conjunction with the attached drawings.

DETAILED DESCRIPTION

FIGS. 2A-2D show an embodiment of the present invention for fabricating a zirconium resistance element for use in a Josephson integrated circuit.

Figure 1A:
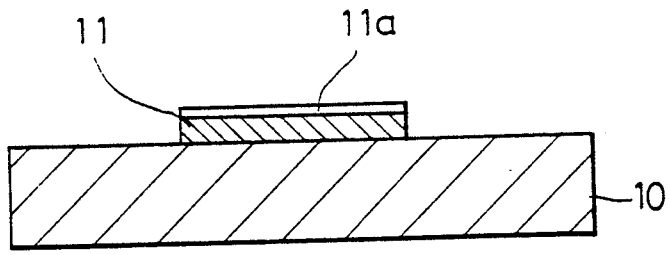
FIGS. 1A-1D are diagrams showing the fabrication step of a conventional resistance element for use in a Josephson integrated circuit.
Figure 1B:
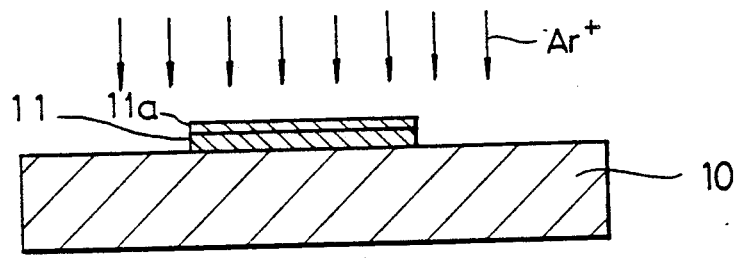
Figure 1C:
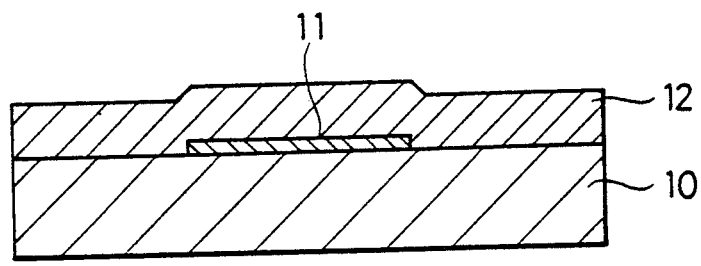
Figure 1D:
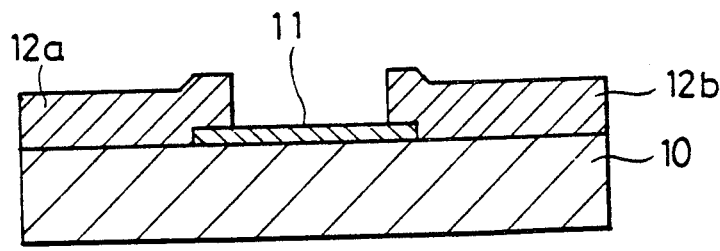
Figure 2A:
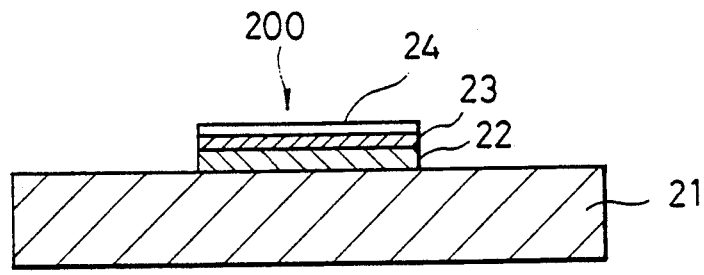
FIGS. 2A-2D are diagrams showing an embodiment of the present invention.

Referring to FIG. 2A, an insulating substrate 21 of silicon oxide and the like, is incorporated into a deposition chamber of a sputtering apparatus (not illustrated) and a zirconium layer 22 is deposited on the substrate 21 by sputtering with a predetermined thickness such as 100 nm. Thereby, the deposition chamber is evacuated as usual and the control of the thickness of the zirconium layer 22 is achieved with high precision. Further, a refractory metal layer 23 is deposited on the zirconium layer 22 by sputtering immediately after the deposition of the layer 22 with a thickness of about 10 nm, using the same sputtering apparatus and without breaking the vacuum of the deposition chamber in the apparatus. This may be done easily by rotating a stage holding the substrate 21 in the deposition chamber from a first position opposing a zirconium target to a second position opposing a target of the refractory metal. The refractory metal layer 23 is preferably made of a refractory metal that exhibits an etching rate, when subjected to an etching process, that is substantially larger than the etching rate of zirconium under the same etching condition. The refractory metal includes niobium, molybdenum, titanium, tantalum, tungsten vanadium, palladium, platinum, and the like. Thereby, a selective removal of the refractory metal layer with respect to the zirconium layer becomes possible a will be described later in the description. Further, the use of metals other than niobium is particularly preferred because of the reason that the resistance value of the obtained resistance element is stable against variation of the resistance with time as will be described later. This, however, by no means excludes niobium from the candidate material for the refractory metal used for the layer 23.

After the deposition of the refractory metal layer 23, the vacuum of the deposition chamber is broken and the substrate 21 is taken out from the sputtering apparatus. This substrate 21 is then subjected to a photolithographic patterning process using a carbon tetrachloride (CCl4) etching gas and thereby the zirconium layer 22 and the refractory metal layer 23 are both patterned to form a resistance strip 200 shown in FIG. 2A. It should be noted that both the zirconium layer 22 and the refractory metal layer 23 have a substantially same etching rate against the CCl4 etching gas. During this process, it will be understood that the surface of the refractory metal layer 23 is exposed to the air. Thereby, there is formed an oxide film 24 of the refractory metal forming the layer 23 as shown in FIG. 2A.

Figure 2B:
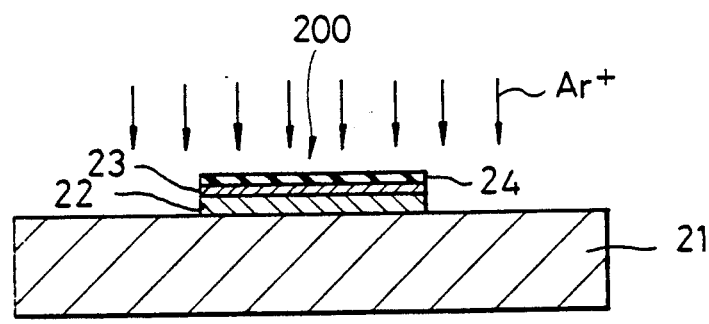

The substrate 21 thus formed with the resistance strip 200 is then subjected to a sputter-etching process, wherein the oxide film 24 is removed by the bombardment of argon ions as illustrated in FIG. 2B. In a typical example, a bias voltage of 200 volts is applied for establishing the argon plasma. A few minutes of sputter-etching is enough for the removal of the oxide film 24.

After the oxide layer 24 is removed, a niobium or niobium alloy superconductor layer 25 is deposited on the substrate 21 including the resistance strip 200 with a thickness of to bury the resistance strip underneath. Thereby, a structure shown in FIG. 2C is obtained.

Figure 2C:
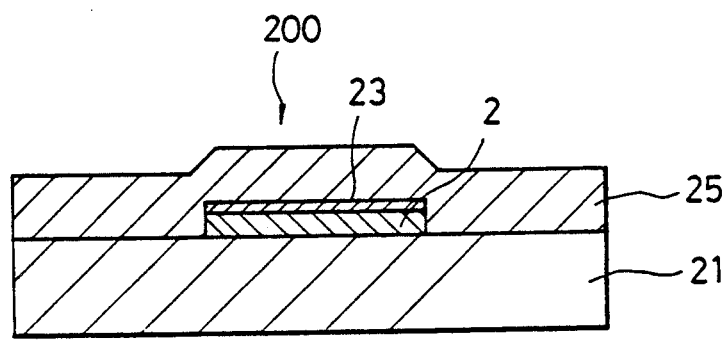
Figure 2D:
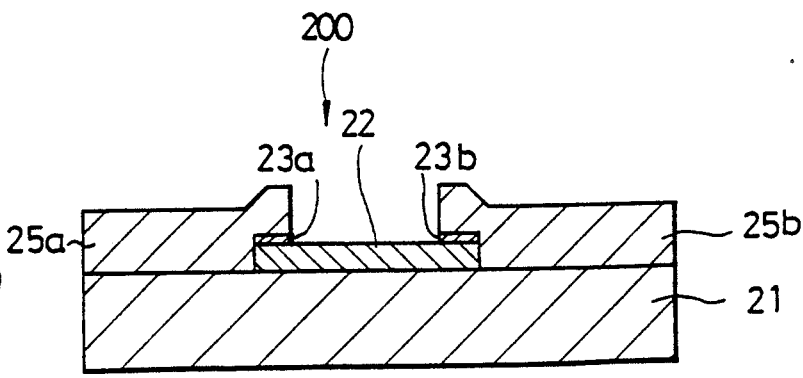

Next, the structure of FIG. 2C is subjected to another photolithographic patterning process, wherein the niobium layer 25 is subjected to an RIE process using the $CF_4$ etching gas to expose the resistance strip 200 as shown in FIG. 2D, except for both ends thereof. Thereby, the niobium superconductor layer 25 is patterned into a first pattern 25a and a second pattern 25b that are separated from each other and cover both ends of the resistance strip 200. Further, the refractory metal layer 23, having the etching rate that is substantially identical with or larger than the etching rate of niobium when subjected to the $CF_4$ etching gas, is also patterned into layers 23a and 23b simultaneously, wherein the layers 23a and 23b remain at both ends of the resistance strip 200 in correspondence to where the first and second superconductor patterns 25a and 25b cover, respectively. On the other hand, the zirconium layer 22 having the etching rate that is substantially smaller than the case of niobium against the $CF_4$ etching gas, remains substantially intact. Thereby, a current path extending from the pattern 25a to the pattern 25b is formed through the zirconium strip 22, via the refractory metal layers 23a and 23b.

In the foregoing RIE process of FIG. 2D, it should be noted that the etching stops automatically when the zirconium layer 22 is exposed as a result of the removal of the niobium layer 25 and the refractory metal layer 23 because of the difference in the etching rate between zirconium and other refractory metals. In other words, the thickness of the zirconium layer 22 in the resistance strip 200 is substantially identical with the initial thickness of the zirconium layer 22 prior to the patterning, and because of this, the resistance strip 200 provides an exact, designed resistance value in the Josephson integrated circuit.

In the foregoing fabrication process, it should be noted that the zirconium layer 22 in the structure of FIG. 2D has a thickness that is substantially identical with the original, as deposited thickness of FIG. 2A, even when the sputter-etching process of FIG. 2B is applied. During the step of FIG. 2B, the zirconium layer 22 is protected from the sputter-etching by the refractory metal layer 23 and thus the thickness of the layer 22 does not change as long as there remains the layer 23 on the layer 22. This refractory metal layer 23 is subsequently removed selectively against the zirconium layer 22 in the RIE process of FIG. 2D. As already noted, the thickness of the zirconium layer does not change substantially because of the reduced etching rate of zirconium against the $CF_4$ etching gas.

In the structure of FIG. 2D thus formed, the superconducting patterns 25a and 25b make a reliable electric contact with the upper major surface of the refractory metal layers 23a and 23b from which the oxide films are removed by the suputter-etching process of FIG. 2B. On the other hand, the side wall of the resistance strip 200 is still covered with oxide film even after the step of FIG. 2B because of the reduced efficiency in the sputter-etching, and no reliable electric contact is achieved between the superconducting patterns 25a, 25b and the resistance strip 200 in the lateral direction. This is the reason why the superconducting patterns 25a and 25b are provided to cover the upper major surface of the resistance strip via the refractory metal layers 23a and 23b.

Next, the structure and fabrication process of a Josephson integrated circuit wherein the resistance strip of the foregoing embodiment is formed will be described.

Figure 3:
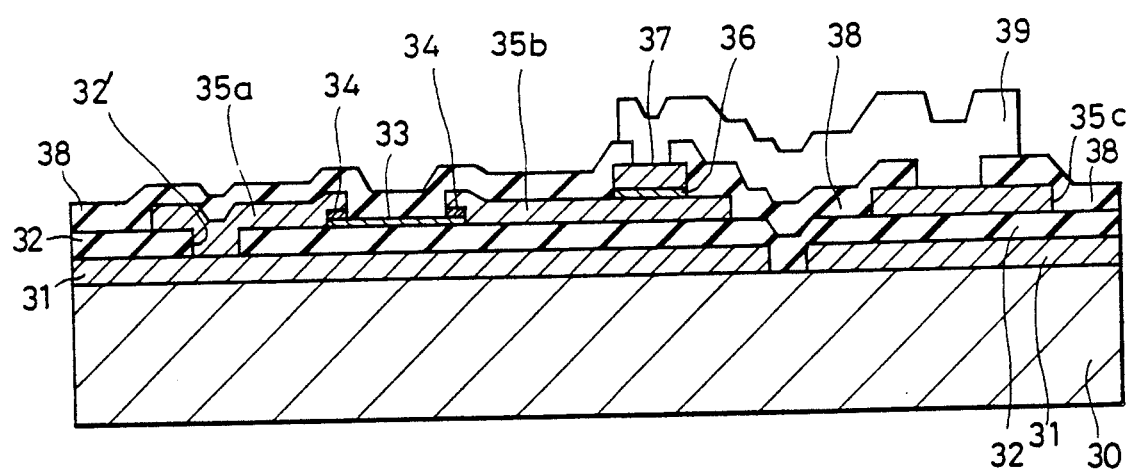
FIG. 3 is a diagram showing the structure of a Josephson integrated circuit wherein the resistance element of the present invention is used.

Referring to FIG. 3 showing a part of the Josephson integrated circuit, the integrated circuit is formed on a silicon substrate 30 and a ground plane 31 of niobium is formed on the silicon substrate 30 with a thickness of 200–300 nm. On the ground plane 31, there is provided a dielectric layer 32 of silicon oxide with a thickness of 200–300 nm, and a zirconium resistance strip 33 is formed on the silicon oxide layer 12 with a thickness of about 100 nm. This thickness of the zirconium strip 33 may be changed as necessary depending on the desired value of resistance.

On the niobium ground plane 31, there is formed a number of lower electrodes 35a, 35b and 35c, all of niobium, with a thickness of about 200 nm, wherein the electrodes 35a and 35b are connected electrically to the zirconium strip 33 via intervening niobium layers 34. Here, it will be understood that the silicon oxide dielectric layer 32 corresponds to the substrate 21, the zirconium strip 33 corresponds to the zirconium layer 22, the niobium layers 34 corresponds to the refractory metal layers 23a and 23b, and the electrodes 35a and 35b correspond respectively to the superconductor patterns 25a and 25b of FIG. 2D.

In the structure of FIG. 3, the niobium electrode 35a is contacted electrically to the ground plane 31 via a contact hole 32' formed in the dielectric layer 32. Further, there is formed a tunneling barrier layer 36 of $AlO_x$ on the niobium lower electrode 35b with a thickness of about 6 nm, and the tunneling barrier layer 36 forms a Josephson junction together with the lower electrode 35b and another, upper electrode 37 of niobium that is formed on the tunneling barrier layer 36 with a thickness of 200 nm.

Further, there is provided a second dielectric layer 38 of silicon oxide to cover the zirconium resistance strip 33, the niobium lower electrodes 35a, 35b and 35c, and the niobium upper electrode 17, with a thickness of 400–600 nm. This second dielectric layer 38 is provided with contact holes that expose a part of the upper electrode 37 and a part of the lower electrode 35c, and another niobium superconducting interconnection pattern 39 is provided on the second dielectric layer 38 for contact with the electrode 37 and the electrode 35c through these contact holes.

In this Josephson integrated circuit, the resistance element is formed with an accurately controlled resistance value by employing the structure and process of FIGS. 2A–2D, and thereby the variation in the operational characteristic in the obtained integrated circuit is minimized.

Next, the process for fabricating the Josephson integrated circuit of FIG. 3 will be described with reference to FIGS. 4A–4J.

Figure 4A:
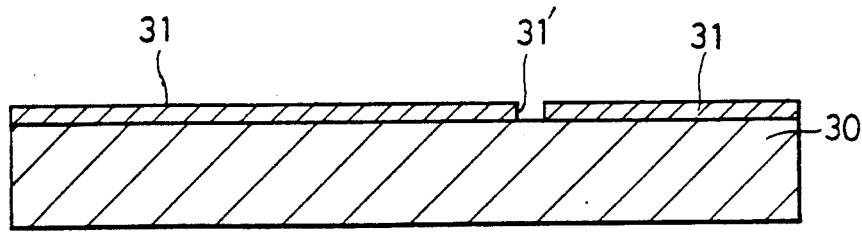
FIGS. 4A-4J are diagrams showing the fabrication step of the integrated circuit of FIG. 3.

Referring to FIG. 4A, the niobium ground plane 31 is provided on the silicon substrate 30 by a sputtering process with the thickness of 200–300 nm. This ground plane 31 is subsequently patterned by a photolithographic patterning process using $CF_4$ to form a moat 31' for removing the residual magnetic flux from the ground plane 31.

Figure 4B:
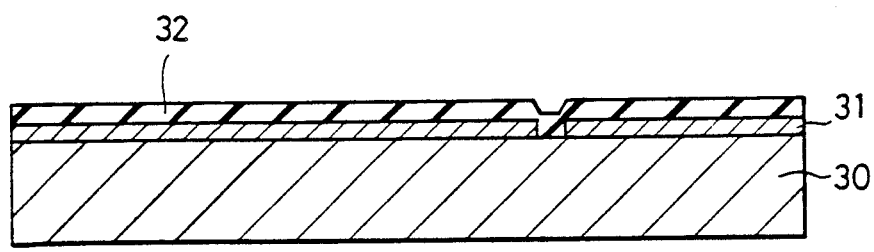
Figure 4C:
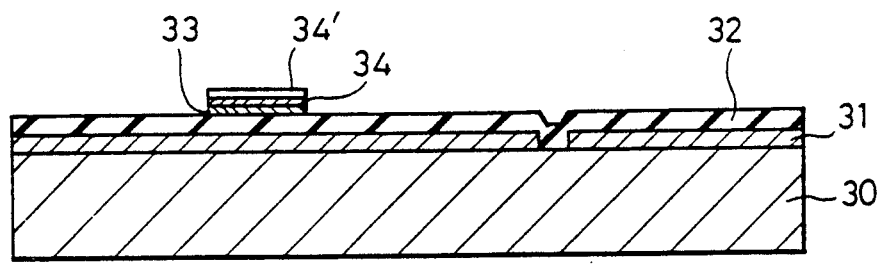

Next, the silicon oxide dielectric layer 12 is provided on the ground plane 31 by a sputtering process with the thickness of 200–300 nm as shown in FIG.4B.

Further, the zirconium resistance layer 13 is provided on the silicon oxide layer 12 by a sputtering process with the thickness of about 100 nm. After the zirconium layer 13 is formed, the niobium layer 14 is deposited subsequently in the same deposition chamber of the sputtering apparatus, without breaking the vacuum, with the thickness of 10–20 nm. After the deposition of the niobium layer 14, the substrate 30 is taken out from the deposition chamber of the sputtering apparatus and is subjected to a photolithographic patterning process, wherein the zirconium strip 33 and the niobium layer 34 are patterned simultaneously by an RIE process employing the CCl₄ etching gas to form a resistance strip shown in FIG. 4C. It should be noted that, during this process of patterning, the niobium layer 34 is exposed to the air and an oxide layer 34' is formed inevitably on the exposed surface of the layer 34.

Next, another photolithographic patterning process is applied to the dielectric layer 12, wherein the layer 12 is subjected to a RIE etching process using CHF₃ as the etching gas. Thereby, a contact hole 32' is formed in the dielectric layer 12 as shown in FIG. 4D.

Figure 4D:
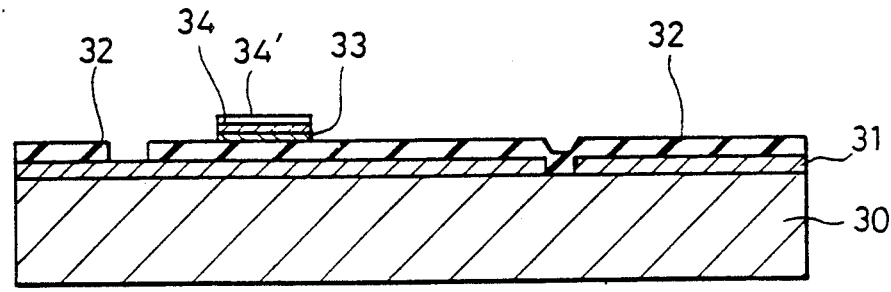
Figure 4E:
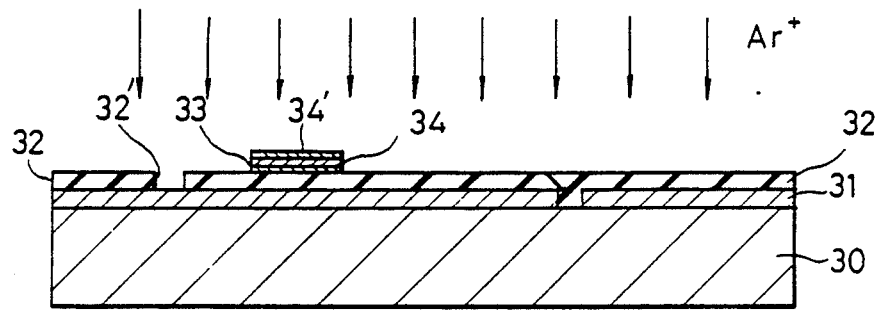

Next, the structure of FIG. 4D is returned to the reaction chamber of the sputtering apparatus and subjected to a sputter-etching process therein as shown in FIG.4E, wherein the oxide film 34' on the niobium layer 34 is removed by the bombardment of argon ions. After the removal of the oxide film 34', the Josephson junction comprising the AlO$_x$ tunneling barrier layer sandwiched by a pair of niobium layers is formed in the same sputtering apparatus. More specifically, the niobium lower electrode 35, the AlO$_x$ tunneling barrier layer 36 and the niobium upper electrode 37 are consecutively deposited in the deposition chamber with the thickness of the layers 35 and 37 set to about 200 nm while the thickness of the layer 36 set to about 6 nm. Thereby, the structure shown in FIG. 4F is obtained.

Figure 4F:
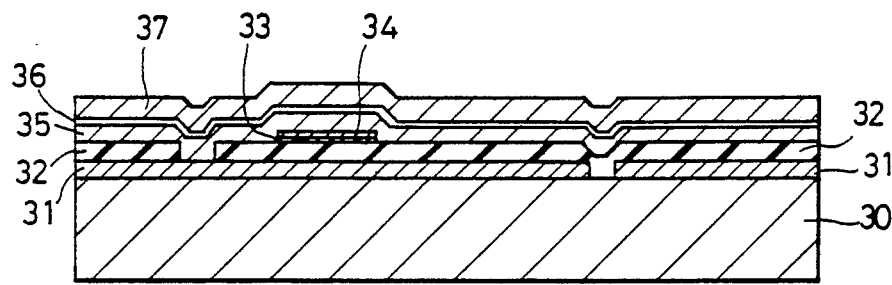
Figure 4G:
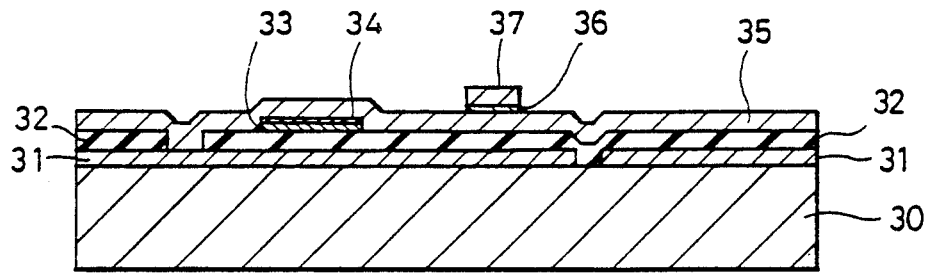

Further, the structure of FIG. 4F is subjected to a photolithographic patterning process, wherein the upper electrode 37 is removed by a RIE process using CF₄ for the etching gas except for a part thereof forming the Josephson junction, and the tunneling barrier layer 36 is removed subsequently except for a part thereof located underneath the part of the electrode 37 that remains unetched. Thereby a structure shown in FIG. 4G is obtained.

Figure 4H:
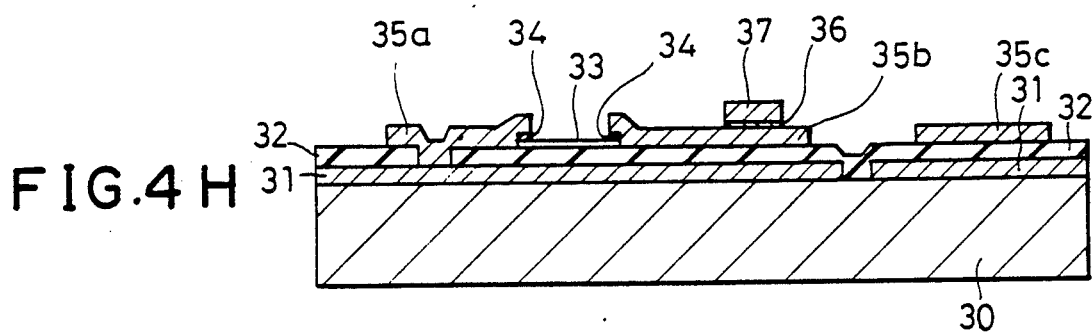

Next, the lower electrode 35 is subjected to the photolithographic patterning process using the RIE process and the CF₄ etching gas to form the electrodes 35a, 35b and 35c as shown in FIG. 4H. Further, the silicon oxide dielectric layer 18 is deposited on the structure of FIG. 4H by a sputtering process with the thickness of 300–400 nm. The layer 38 is subsequently subjected to the photolithographic patterning, wherein there is formed a contact hole 38' in the layer 38 by a RIE process using the CHF₃ etching gas. Thereby a structure shown in FIG. 4I is obtained.

Figure 4I:
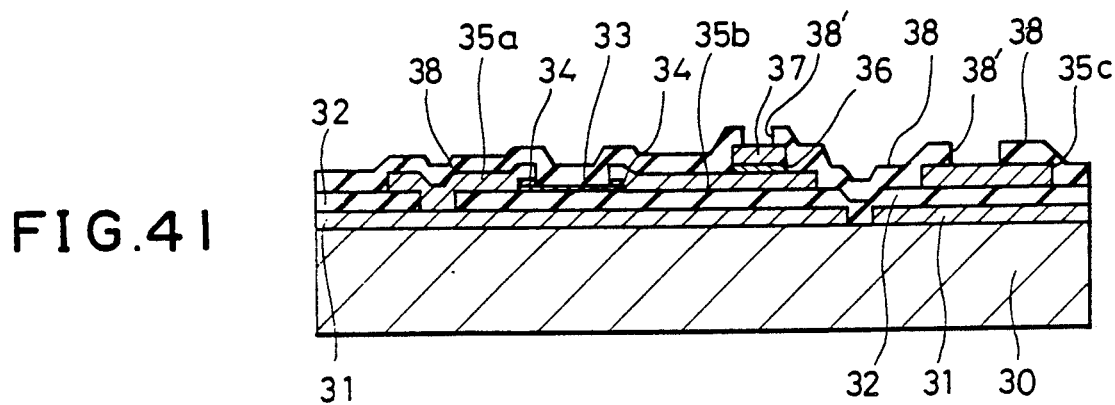
Figure 4J:
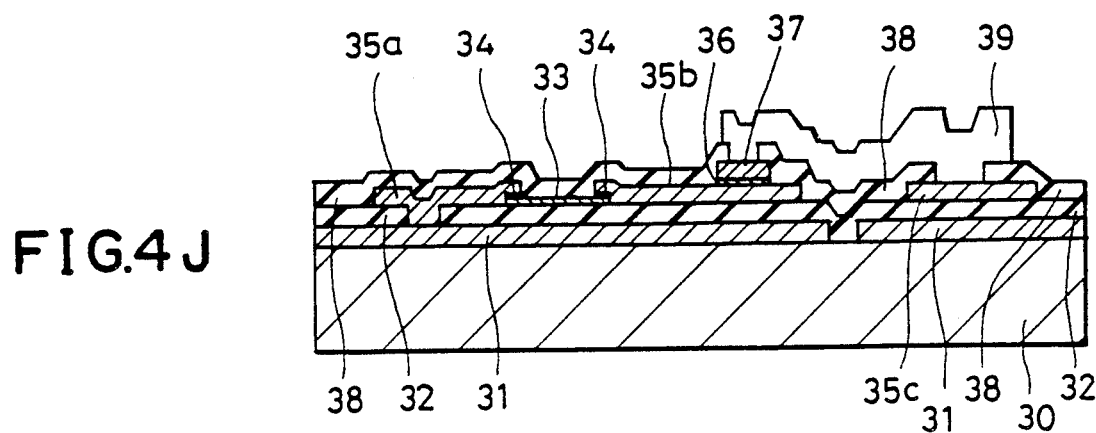

Next, a niobium layer forming the niobium superconductor interconnection layer 39 is provided on the structure of FIG. 4I by a sputtering process with the thickness of 400–600 nm. This layer is subsequently patterned by the RIE process using the CF₄ etching gas and the patterned interconnection 39 is obtained as shown in FIG. 4J.

With the foregoing steps, the Josephson integrated circuit of FIG. 3 is completed. In this device, the problem of unwanted etching of the zirconium layer does not occur in the step of FIG. 4E because of the niobium layer 34 protecting the zirconium strip 33. Thereby, the problem of variation of the resistance value of the resistance element due to the uncontrollable etching pertinent to the conventional Josephson integrated circuit is successfully eliminated by the construction of the present invention.

About the etching process of FIG. 4H, five minutes of etching would be enough for patterning the niobium electrode 35. It was found experimentally that the etching rate of zirconium by the RIE process achieved by using the CF₄ etching gas is about 0.7 nm/min. This means that the etching of the zirconium strip 33 by the foregoing RIE process continued for 2 minutes would cause the decrease in the thickness of only 1.4 nm in the zirconium layer. When the resistance element is designed to have a sheet resistance of 5Ω/□, the thickness of the zirconium strip 33 needed to achieve this sheet resistance becomes about 100 nm. In this case, for example, the increase in the sheet resistance from the designed value is estimated to be only about 1.7%, even when the effect of the layer thickness that changes the sheet resistance with the power of −1.2, is taken into consideration. As it is usual to design the resistance with the tolerance of 10%, such a deviation does not provide any serious effect of the operation of the Josephson integrated circuit.

In the foregoing first embodiment, it was found that there are cases in which the resistance of the resistance element changes with time when niobium is used for the refractory metal layer 23 or 34. For example, when the integrated circuit of FIG. 3 is left at the room temperature for four months, it was found that the value of resistance decreases by −0.52% to even −58%. This problem is successfully eliminated when other metals such as titanium, vanadium, tantalum, tungsten, platinum or palladium is used for the refractory metal layer 23 or 34. A similar effect is obtained when any of molybdenum, vanadium, tantalum and tungsten is used for the refractory material layer. Further, use of noble metals such as palladium or platinum may be possible although these metals may require additional etching processing.

Further, the present invention is not limited to the embodiments described heretofore, but various variations and modifications may be made without departing from the scope of the invention.

What is claimed is:

1. A Josephson integrated circuit including therein a Josephson device, said Josephson integrated circuit comprising:

a substrate having an upper major surface and a lower major surface and formed with a Josephson device on the upper major surface;

a resistance strip of zirconium having a lower major surface and an upper major surface and provided on the upper major surface of the substrate;

a first refractory metal layer having a lower major surface and an upper major surface and provided on a first region of the upper major surface of the resistance strip;

a second refractory metal layer having a lower major surface and an upper major surface and provided on a second region of the upper major surface of the resistance strip that is separated from said first region;

a first superconductor interconnection pattern provided on the upper major surface of the substrate so as to cover the upper major surface of the first refractory metal layer; and a second superconductor interconnection pattern separated from the first superconductor interconnection pattern and provided on the upper major surface of the substrate so as to cover the upper major surface of the second refractory metal layer.

2. A Josephson integrated circuit as claimed in claim 1 in which said first and second refractory metal layers comprise a refractory metal that shows an etching rate substantially larger than that of zirconium when applied to an etching process.

3. A Josephson integrated circuit as claimed in claim 1 in which said first and second refractory metal layers comprise a refractory metal selected from a group consisted of titanium, vanadium, tantalum, tungsten, molybdenum and niobium.

* * * * *